(12) United States Patent
Takimoto

(10) Patent No.: US 10,955,305 B2
(45) Date of Patent: Mar. 23, 2021

(54) SENSOR CHIP JUNCTION STRUCTURE AND PRESSURE SENSOR

(71) Applicant: SAGINOMIYA SEISAKUSHO, INC., Tokyo (JP)

(72) Inventor: Kazuya Takimoto, Sayama (JP)

(73) Assignee: SAGINOMIYA SEISAKUSHO, INC., Tokyo (JP)

( * ) Notice: Subject to any disclaimer, the term of this patent is extended or adjusted under 35 U.S.C. 154(b) by 0 days.

(21) Appl. No.: 16/625,397

(22) PCT Filed: Jun. 20, 2018

(86) PCT No.: PCT/JP2018/023533
§ 371 (c)(1),
(2) Date: Dec. 20, 2019

(87) PCT Pub. No.: WO2018/235882
PCT Pub. Date: Dec. 27, 2018

(65) Prior Publication Data
US 2020/0386642 A1    Dec. 10, 2020

(30) Foreign Application Priority Data
Jun. 23, 2017  (JP) .............................. JP2017-123085

(51) Int. Cl.
*G01L 9/00* (2006.01)
*G01L 19/04* (2006.01)

(52) U.S. Cl.
CPC .................................. *G01L 9/0051* (2013.01)

(58) Field of Classification Search
CPC ... G01L 9/00–08; G01L 9/0051; G01L 19/00; G01L 19/04
See application file for complete search history.

(56) References Cited

U.S. PATENT DOCUMENTS 5,225,373 A * 7/1993 Takahashi et al. ..... H01L 21/60
                                                   437/209
5,483,106 A * 1/1996 Echigo et al. .......... H01L 23/48
                                                   257/783
(Continued)

FOREIGN PATENT DOCUMENTS

CN    106662493        5/2017
DE    103 16 084 A1    5/2004
(Continued)

OTHER PUBLICATIONS

International Search Report dated Aug. 21, 2018, issued in PCT Application No. PCT/JP2018/023533, filed Jun. 20, 2018.
(Continued)

*Primary Examiner* — Nguyen Q. Ha
(74) *Attorney, Agent, or Firm* — Workman Nydegger

(57) ABSTRACT

In a sensor chip junction structure, if a moving distance of a tip of a press jig (56) is any of 50 μm and 30 μm, for example, a characteristic line of a load (shearing force) (N) applied to an adhesive layer (50) formed on a sensor chip that is integral with a glass pedestal, the glass pedestal having a thickness set in a range from 0.3 mm to 2.5 mm is either located on any of a characteristic line Lt1 ($y=1.3889x^3$) and a characteristic line Lt2 ($y=0.463x^3$) or located in a region above zero and equal to or below any of the characteristic line Lt1 and the characteristic line Lt2.

26 Claims, 18 Drawing Sheets

(56) References Cited

U.S. PATENT DOCUMENTS

| | | | |
|---|---|---|---|
| 5,986,316 A * | 11/1999 | Toyoda et al. | H01L 29/06 |
| | | | 257/419 |
| 5,994,161 A | 11/1999 | Bitko et al. | |
| 6,169,316 B1 * | 1/2001 | Sakai et al. | H01L 29/82 |
| | | | 257/419 |
| 2007/0220989 A1 | 9/2007 | Uchigashima et al. | |
| 2019/0195718 A1 * | 6/2019 | Takimoto et al. | G01L 19/147 |

FOREIGN PATENT DOCUMENTS

| | | | | |
|---|---|---|---|---|
| JP | 10170367 A * | 6/1998 | | G01L 19/04 |
| JP | 2003-247903 A | 9/2003 | | |
| JP | 2003270068 A * | 9/2003 | | G01L 9/00 |
| JP | 2007-248232 A | 9/2007 | | |
| JP | 4444424 B2 | 3/2010 | | |
| JP | 2013-11478 A | 1/2013 | | |
| JP | 2014-134427 A | 7/2014 | | |
| JP | 2014-153073 A | 8/2014 | | |
| JP | 2015-75422 A | 4/2015 | | |
| JP | 2016-45172 A | 4/2016 | | |

OTHER PUBLICATIONS

Written Opinion dated Aug. 21, 2018, issued in PCT Application No. PCT/JP2018/023533, filed Jun. 20, 2018.
European Search Report dated May 29, 2020, issued in EP Application No. 18820839.1.

* cited by examiner

SENSOR CHIP JUNCTION STRUCTURE AND PRESSURE SENSOR

TECHNICAL FIELD

The present invention relates to a sensor chip junction structure and a pressure sensor.

BACKGROUND ART

As shown in Patent Document 1, for example, a sensor unit constituting part of a liquid sealing semiconductor pressure sensor is placed in a liquid sealing chamber (a pressure receiving space) formed between a base and a diaphragm. Such sensor unit comprises, as its main constituents, the diaphragm to be sandwiched between the base and a receiving member, the pressure receiving space formed above the diaphragm and serving as the liquid sealing chamber configured to store an oil serving as a pressure transfer medium, a sensor chip (which is referred to as a semiconductor pressure detection element in Patent Document 1) placed in the pressure receiving space and configured to detect a pressure variation of the oil through the diaphragm, the base configured to support the sensor chip, and a plurality of lead pins configured to send out an output signal from the sensor chip and to supply power to the sensor chip, for example.

As shown in Patent Document 2, for example, there is a case where the aforementioned sensor chip is adhered to a bottom wall portion (a chip mounting member), which forms a bottom part of a recess formed in a package member, through an adhesive layer made of a silicone-based adhesive. The adhesive layer has a predetermined Young's modulus and a thickness of the adhesive layer is set equal or above a predetermined thickness. The thickness of the adhesive layer is set as described above because, as the thickness of the adhesive layer is larger, force applied from the package member to a sensor element is more likely to be relaxed by the adhesive layer and variations in characteristics of the sensor due to a change in temperature can also be suppressed to a minimum.

PRIOR ART DOCUMENTS

Patent Document

Patent Document 1: Japanese Patent Application Laid-Open No. 2016-45172
Patent Document 2: Japanese Patent Application Laid-Open No. 2003-247903

SUMMARY OF INVENTION

In the sensor chip used for the pressure sensor as described above, when a temperature around the pressure sensor changes, a thermal stress is generated between the sensor chip and the bottom wall portion based on differences among a coefficient of linear expansion of the sensor chip, a coefficient of linear expansion of the adhesive layer, and a coefficient of linear expansion of the bottom wall portion (the chip mounting member). As this cause the sensor chip to distort, whereby an output characteristic of the sensor chip is altered in accordance with the degree of distortion, which may cause error of pressure detection accuracy as a consequence. For example, as shown in FIG. 5, there is a case where pressure detection integrated accuracy (% FS) varies with the change in the temperature around the pressure sensor. In FIG. 5, the vertical axis indicates the pressure detection integrated accuracy (% FS) while the horizontal axis indicates the temperature (C), and characteristic lines La1 and La2 representing the variations of the pressure detection integrated accuracy according to the change in the temperature are plotted therein. The characteristic line La1 shows a characteristic of a sensor chip that has relatively large error of pressure detection integrated accuracy according to the change in an ambient temperature while the characteristic line La2 shows a characteristic of a sensor chip that has relatively small error of pressure detection integrated accuracy with the change in an ambient temperature.

Moreover, in the case where the above-mentioned thermal stress is changed due to a predisposition of a viscoelastic properties of the adhesive layer, because it takes some time for the thermal stress to reach a state of equilibrium, there may also be a case where error of pressure detection accuracy (% FS) is caused by a deterioration in deviation of detection accuracy due to temperature response. In FIG. 6, the vertical axis indicates the pressure detection accuracy (% FS) while the horizontal axis indicates time (t), and a characteristic line Lb2 representing an output characteristic of a sensor chip with a delay in response of temperature and a characteristic line Lb1 representing an output characteristic of a sensor chip which is free from a delay in response of temperature are plotted therein. Note that a characteristic line Lt in FIG. 6 represents a temperature cycle that changes from a predetermined high temperature Ta to a predetermined low temperature Tb in a thermostatic chamber of a test apparatus. In FIG. 6, the characteristic line Lb2 shows an output that varies behind the change in temperature while the characteristic line Lb1 shows an output that varies along with the change in temperature. Hereby, at a given point t1 in time, a deviation $\Delta D$ of accuracy is relatively small in the characteristic line Lb1 but is relatively large in the characteristic line Lb2. One of factors for the delay in response where the output varies behind the change in temperature lies in a characteristic of the adhesive layer.

Conventionally, evaluation as to whether or not a sensor chip is a good sensor chip such that its error of pressure detection accuracy (output characteristic) of the above-mentioned sensor chip falls within the predetermined range is conducted after manufacturing a pressure sensor embedding the sensor chip by measuring the output characteristic of the pressure sensor (also referred to as a workpiece) in accordance with a predetermined temperature cycle in the thermostatic chamber.

However, it takes time to fit the workpiece to the temperature in the thermostatic chamber so as to check the temperature characteristic of the manufactured pressure sensor and a work efficiency is therefore deteriorated.

In view of the above-described problem, the present invention aims to provide a sensor chip junction structure and a pressure sensor. The sensor chip junction structure can enter error of pressure detection accuracy (an output characteristic) of a sensor chip into a predetermined range with a sensor unit alone, and increase production efficiency of such pressure sensors.

To achieve the above-described object, a sensor chip junction structure according to the present invention comprises: an adhesive layer; and a support member for adhering and supporting a sensor chip including a glass pedestal through the adhesive layer coated on an end surface of the support member. If a thickness of the glass pedestal for the sensor chip is defined as x (mm) and shearing force is defined as y (N), the adhesive layer through which the sensor chip is adhered has a characteristic in which the shearing force y (N) satisfying a relational expression (1) ($0 \leq y \leq 1.3889x^3$) is applied in a case where the sensor chip is moved substantially in parallel to the end surface of the support member in an amount of 50 μm.

Another sensor chip junction structure according to the present invention includes: an adhesive layer; and a support member for adhering and supporting a sensor chip including a glass pedestal through the adhesive layer coated on an end surface of the support member. Here, if a thickness of the glass pedestal for the sensor chip is defined as x (mm) and shearing force is defined as y (N), the adhesive layer through which the sensor chip is adhered has a characteristic in which the shearing force y (N) satisfying a relational expression (2) ($0 \leq y \leq 0.463x^3$) is applied in a case where the sensor chip is moved substantially in parallel to the end surface of the support member in an amount of 30 μm.

Moreover, a pressure sensor according to the present invention comprises one of the above-describe sensor chip junction structures.

Furthermore, another pressure sensor according to the present invention includes: a liquid sealing chamber isolated by a diaphragm made of a metal, the liquid sealing chamber being filled with a pressure transfer medium; a sensor chip provided on an end surface of a support member that is located in the liquid sealing chamber and faces the diaphragm, in which a pressure detection element for detecting a pressure in the liquid sealing chamber and an integrated electronic circuit for processing an output signal from the pressure detection element are integrally formed in the sensor chip; a lead pin for leading the output signal from the sensor chip to outside; and one of the above-described sensor chip junction structures.

In any of the pressure sensors described above, the sensor chip may have a size in a range from 2.5 mm square to 4.0 mm square inclusive.

In any of the pressure sensors described above, a thickness of a glass pedestal for the sensor chip may be in any of the following ranges from 0.3 mm to 0.5 mm inclusive, from 0.5 mm to 0.7 mm inclusive, from 0.7 mm to 0.9 mm inclusive, from 0.9 mm to 1.1 mm inclusive, from 1.1 mm to 1.5 mm inclusive, from 1.5 mm to 2.0 mm inclusive, and from 2.0 mm to 2.5 mm inclusive.

The adhesive layer may be formed from any one of a silicone-based gel, a fluorine-based gel, a silicone-based adhesive, and a fluorine-based adhesive, and a thickness of the adhesive layer may be in a range from 0.5 μm to 100 μm inclusive or preferably in a range from 5 μm to 100 μm inclusive.

According to the sensor chip junction structure and the pressure sensor of the present invention, if the thickness of the glass pedestal for the sensor chip is defined as x (mm) and the shearing force is defined as y (N), the adhesive layer through which the sensor chip is adhered has the characteristic in which the shearing force y (N) satisfying the relational expression (1) ($0 \leq y \leq 1.3889x^3$) is applied in the case where the sensor chip is caused to move substantially in parallel to the end surface of the support member in the amount of 50 μm. Therefore, error of pressure detection accuracy (an output characteristic) of the sensor chip can be entered into a predetermined range on a sensor unit alone, and production efficiency of such pressure sensors can be increased at the same time.

DESCRIPTION OF EMBODIMENTS

Figure 4A:
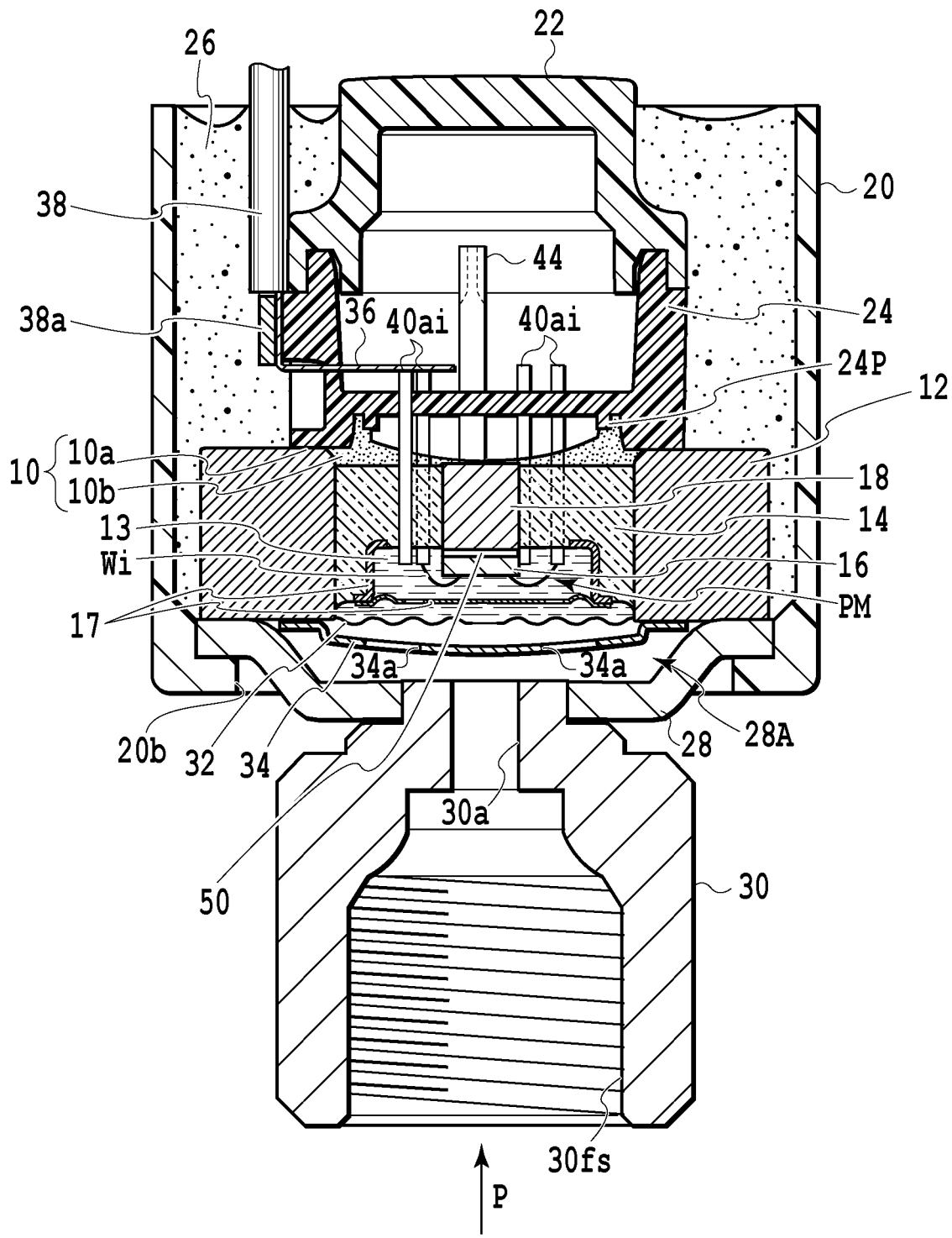
FIG. 4A is a cross-sectional view illustrating a configuration of a pressure sensor including a sensor unit provided with the example of the sensor chip junction structure according to the present invention.
Figure 4B:
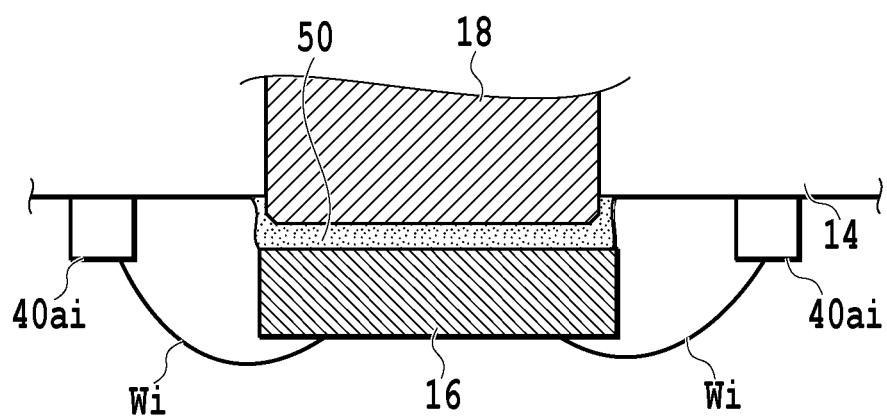
FIG. 4B is a partial cross-sectional view showing a partial enlarged main part in FIG. 4A.
Figure 5:
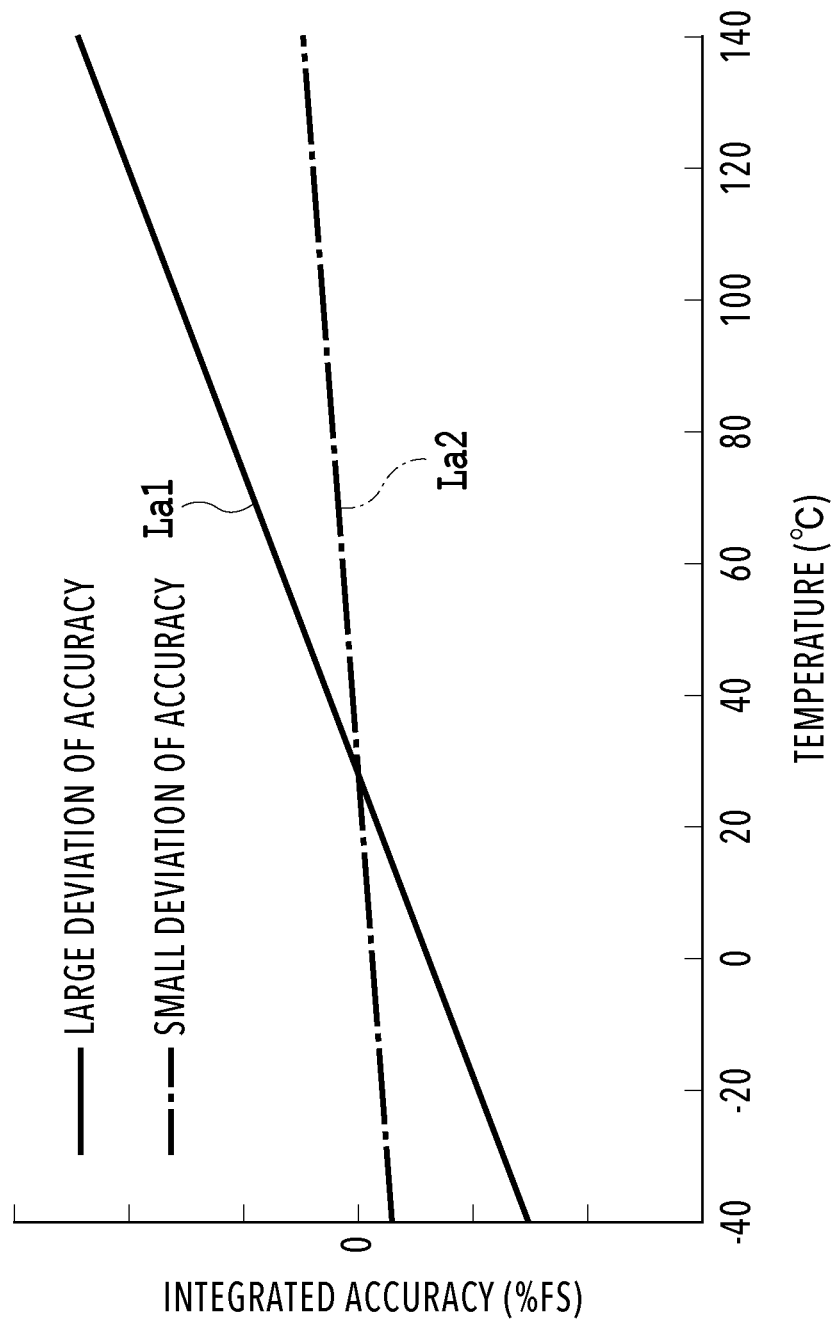
FIG. 5 is a diagram representing characteristic lines representing variations in pressure detection integrated accuracy according to a change in temperature.
Figure 6:
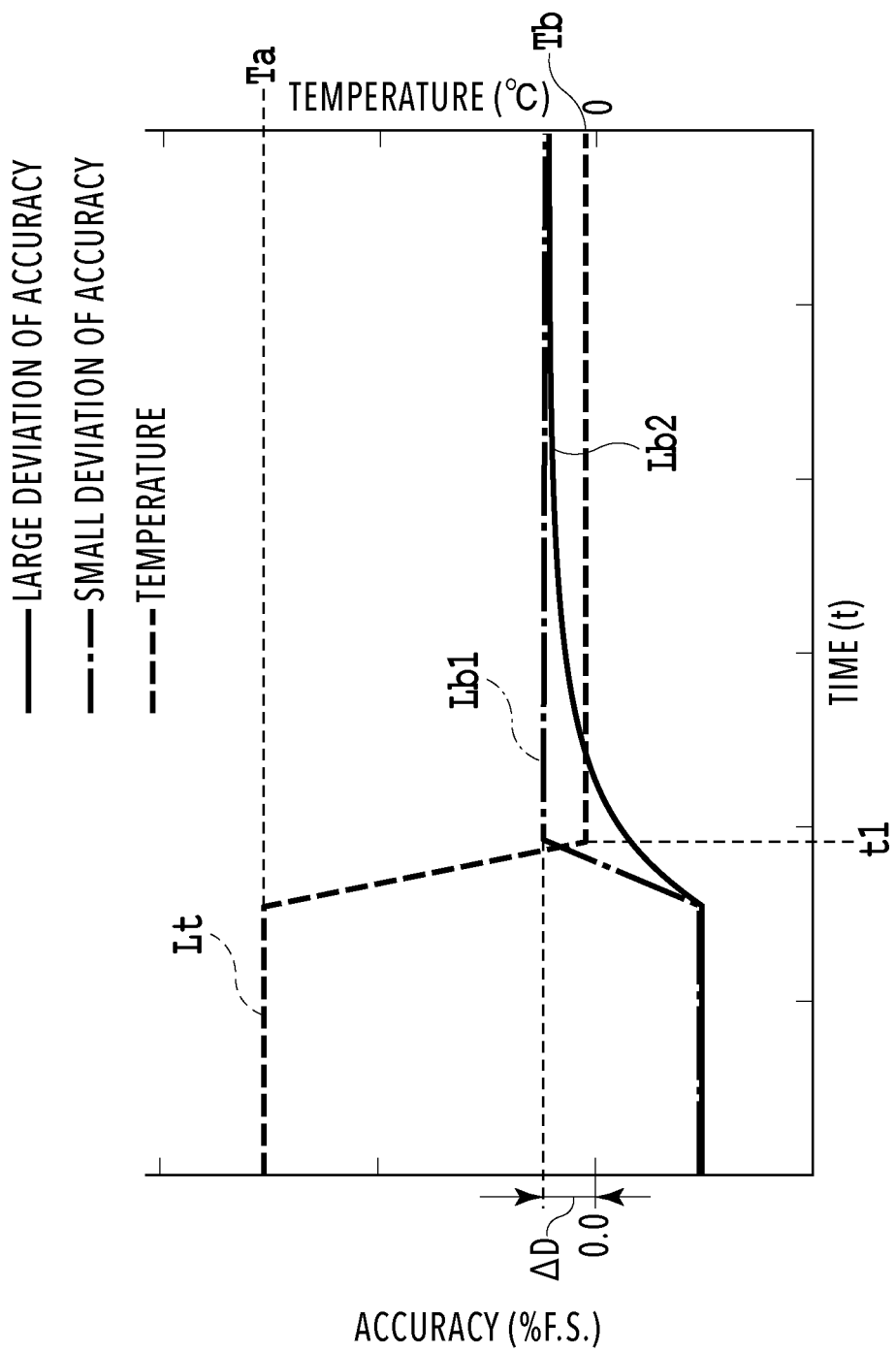
FIG. 6 is a diagram showing characteristic lines representing output characteristics of a sensor chip with a delay in response of temperature and of a sensor chip which is free from a delay in response of temperature.

FIG. 4A schematically illustrates a configuration of a pressure sensor including a sensor unit provided with an example of a sensor chip junction structure according to the present invention.

In FIG. 4A, a pressure sensor comprises a joint member 30 joined to a piping for guiding a fluid to be subjected to pressure detection, and a sensor unit accommodating portion connected to a base plate 28 of the joint member 30 and configured to accommodate a sensor unit to be described later and to supply a detection output signal from the sensor chip to a given pressure measurement apparatus.

The joint member 30 made of a metal has a female screw portion 30fs which is provided therein and is configured to be threaded into a male screw portion of a junction of the aforementioned piping. The female screw portion 30*fs* communicates with a port 30*a* of the joint member 30 that brings the fluid supplied in a direction indicated with an arrow P to a pressure chamber 28A to be described later. An open end on one side of the port 30*a* is open toward the pressure chamber 28A which is formed between the base plate 28 of the joint member 30 and a diaphragm 32 of the sensor unit.

An outer contour portion of the sensor unit accommodating portion is formed from a cylindrical waterproof case 20 serving as a cover member. An opening 20*b* is formed at a lower end portion of the waterproof case 20 made of a resin. A rim of the base plate 28 of the joint member 30 is engaged with a stepped portion on a rim of the opening 20*b* located inside.

Either air or a liquid is supplied as the fluid into the pressure chamber 28A through the port 30*a* of the joint member 30. A lower end surface of a housing 12 of the sensor unit is welded to the base plate 28.

The sensor unit for detecting a pressure inside the pressure chamber 28A and sending out the detection output signal comprises, as its main constituents: the housing 12 in a cylindrical shape; the diaphragm 32 made of a metal and configured to isolate the pressure chamber 28A from an inter peripheral portion of the housing 12; a sensor chip 16 provided with a plurality of pressure detection elements; a chip mounting member 18 made of a metal for supporting the sensor chip 16 at one end portion thereof through an adhesive layer 50; input-output terminals group 40*ai* (i=1 to 8) which are electrically connected to the sensor chip 16; and a hermetic glass 14 configured to fix the input-output terminals group 40*ai* and an oil filling pipe 44 between an outer peripheral surface of the chip mounting member 18 and an inner peripheral surface of the housing 12.

The diaphragm 32 is supported by a one of end surfaces on a lower side of the housing 12 on a lower side facing the above-mentioned pressure chamber 28A. A diaphragm protection cover 34 for protecting the diaphragm 32 provided in the pressure chamber 28A includes a plurality of communication holes 34*a*. A rim of the diaphragm protection cover 34 and a rim of the diaphragm 32 are joined by welding to the lower end surface of the housing 12 which is made of stainless steel.

A liquid sealing chamber 13 which is formed between the sensor chip 16 facing the metallic diaphragm 32 and an end surface of the hermetic glass 14 is filled with a predetermined amount of either silicone oil PM or a fluorine-based inert liquid as a pressure transfer medium, for example, through the oil filling pipe 44. Here, one of end portions of the oil filling pipe 44 is squashed and blocked as indicated with chain double-dashed lines after the oil filling.

The silicone oil adopts silicon oil having a dimethylpolysiloxyane structure formed from a siloxane bond and an organic methyl group, for example. The fluorine-based inert liquid may be any of a liquid having a perfluorocarbon structure, a liquid having a hydrofluoroether structure, and a chlorotrifluoroethylene low polymer structure in which fluorine and chlorine atoms are bonded to a main chain and the fluorine and chlorine atoms are located on two ends thereof, for example.

An electric potential control member 17 made of a metal is further supported by a lower end surface of the hermetic glass 14 between the sensor chip 16 and the diaphragm 32 provided in a recess formed at an end portion of the hermetic glass 14. The electric potential control member 17 is connected to a terminal as shown in Japanese Patent Publication No. 3987386, for example, which is provided with a communication hole and connected to zero potential of a circuit of the sensor chip 16.

The input-output terminals group 40*ai* (i=1 to 8) include two power supply terminals, one output terminal, and five control terminals. Two end portions of each terminal project toward the aforementioned recess formed at the end portion of the hermetic glass 14 and toward a hole in a terminal base 24 to be described later, respectively. Each of the two power supply terminals and the one output terminal is connected to a core wire 38*a* of each corresponding lead line 38 through a connection terminal 36. Each lead line 38 is connected to the given pressure measurement apparatus. Note that FIG. 4A illustrates only four terminals out of the eight terminals.

The sensor chip 16 comprises a plurality of pressure detection elements constituting a bridge circuit, which are located on an upper part of a silicon diaphragm portion. For example, the sensor chip 16 comprises: a body portion made of silicon and formed into a substantially rectangular shape; an electronic circuit layer formed around the pressure detection elements on an upper end surface of the body portion and configured to integrally form an amplification circuit for processing an output signal from the aforementioned bridge circuit, a linearity correction circuit, a temperature correction circuit, and a correction data holding circuit; and an oxide film forming an insulating film layer as a second layer to be laminated on an upper surface of the electronic circuit layer that serves as a first layer.

Note that in another example of the sensor chip junction structure according to the present invention, the sensor chip 16 may be formed on a glass pedestal in a predetermined thickness along with a diaphragm portion. The sensor chip 16 integrated with the glass pedestal is adhered to the one end portion of the chip mounting member 18 through the adhesive layer 50 as described later. In this instance, in order to obtain test data for this application, verifications have been conducted by using the glass pedestal for the sensor chip 16 having the thickness in a range from 0.3 mm to 3.0 mm inclusive or preferably in a range from 0.3 mm to 1.2 mm inclusive, for example, and by using the sensor chip having a size in a range from 0.8 mm square to 5.0 mm square inclusive or preferably in a range from 2.5 mm square to 4.0 mm square inclusive, for example.

Figure 3A:
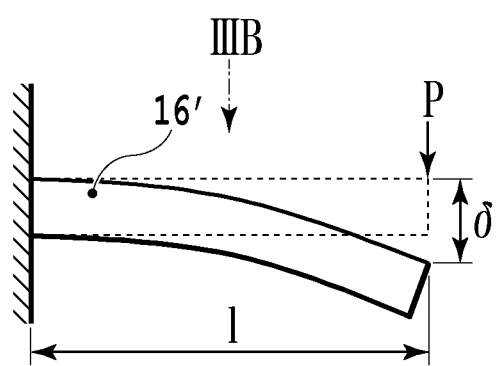
FIG. 3A is a diagram made available for explanation of flexure of a typical glass pedestal and of a sensor chip used in the example of the sensor chip junction structure according to the present invention.
Figure 3B:
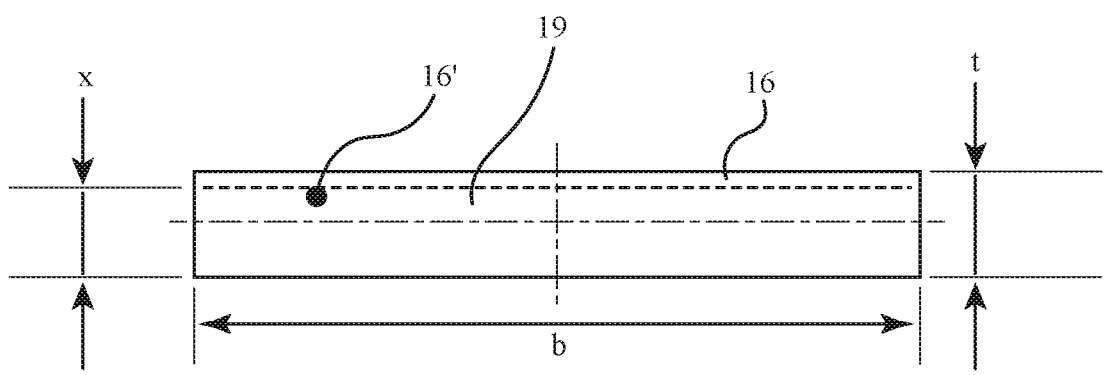
FIG. 3B is a side view of the glass pedestal and the sensor chip shown in FIG. 3A.

One of reasons for causing deviation of detection accuracy of the sensor chip 16 attributable to chip bending that is associated with displacement of the diaphragm portion of the sensor chip 16 lies in flexibility ($\delta$) of the glass pedestal and the sensor chip 16 integrated together. In a case of investigation while using a simplified model (on the assumption that a flexure angle $d\delta/dx$ is smaller than 1) designed such that a concentrated load is applied to a free end of a cantilever regarding the flexure of the glass pedestal as well as the sensor chip as shown in FIGS. 3A and 3B, for example, a cantilever 16' (hereinafter also referred to as a beam 16') corresponding to the glass pedestal 19 and the sensor chip 16 integrated together is assumed. The beam 16' has a rectangular cross-section having a width b and a thickness t and has a length l, and one end thereof is supported.

The magnitude [$=Pl^3/(3EI)$] of the flexure $\delta$ is inversely proportional to flexural rigidity (EI) (E: a Young's modulus, I: a moment of inertia of area) and is proportional to the cube of the length l of the beam 16'. Moreover, the magnitude of the flexure $\delta$ is inversely proportional to the cube of the thickness t based on the moment of inertia of area I ($=bt^3/12$). Accordingly, the magnitude of the flexure $\delta$ tends to become larger by setting the smaller thickness t of the beam 16' (the glass pedestal) and setting the larger length l of the beam 16' in such a way as to reduce the moment of inertia of area I. Namely, because the glass pedestal and the sensor chip 16 integrated together is easy to deflect by setting the size of the sensor chip 16 near 4.0 mm square and setting the thickness of the glass pedestal near 0.3 mm, for instance, the deviation of detection accuracy of the sensor chip 16 attributable to the chip bending associated with the displacement of the diaphragm portion is presumably reduced.

It is to be noted, however, that the thickness of the glass pedestal for the sensor chip 16 and the size of the sensor chip 16 are not limited only to the above, but are merely intended to determine an application range of the load to be described later.

In the example of the sensor chip junction structure according to the present invention, the sensor chip 16 is adhered to the one end portion of the chip mounting member 18 through the adhesive layer 50 serving as the adhesive layer. A material of the adhesive layer 50 can be appropriately selected from the following group including an epoxy-based adhesive, a urethane-based adhesive, a silicone-based adhesive, a fluorine-based adhesive, a silicone-based gel, and a fluorine-based gel, for example, which are arranged in descending order of the Young's modulus (equivalent to the hardness). In order to obtain the test data for this application, the silicon-based gel and the fluorine-based gel were used at this time as the materials for the adhesive layer. In this instance, the adhesive layer used therein has the thickness in a range from 0.5 μm to 100 μm inclusive or preferably in a range from 5 μm to 100 μm inclusive.

It has been verified that the deviation of accuracy of the sensor chip 16 due to the temperature response and accuracy at a low temperature are improved in the case where fixation of the sensor chip 16 to the one end portion of the chip mounting member 18 is weak (loose) by the inventor of the present application. One of reasons therefor is that a thermal stress is small in the case where fixation of the sensor chip 16 to the one end portion of the chip mounting member 18 is weak and the deviation of accuracy due to the temperature response is therefore improved. The degree of fixation (such as whether it is strong or weak) of the sensor chip 16 to the one end portion of the chip mounting member 18 is represented by a change in shearing force (load) in response to a predetermined amount of movement of a press jig 56 in the measurement apparatus to be described later in a case where a shearing force (the load) is acted by the press jig 56 on the adhesive layer 50 (see FIG. 3C), for example.

Figure 3C:
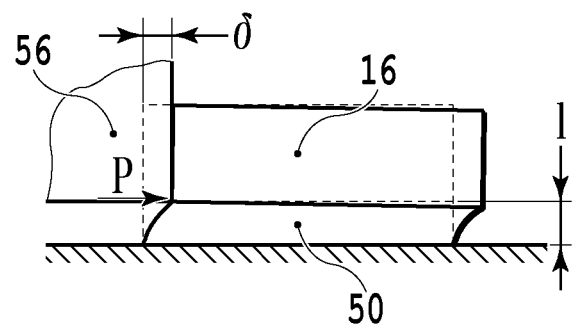
FIG. 3C is a diagram made available for explanation of an adhesive layer used in the example of the sensor chip junction structure according to the present invention.
Figure 3D:
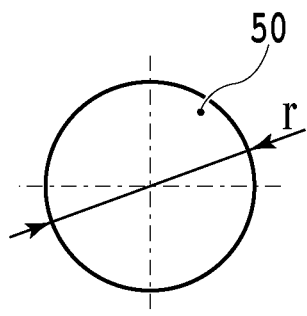
FIG. 3D is a diagram representing the adhesive layer of a circular shape.

For instance, in the case where the sensor chip 16 is adhered to the one end portion of the chip mounting member 18 by using the adhesive layer 50 having the predetermined thickness 1, the Young's modules E, the moment of inertia of area I, and a circular adhesive area $\pi r^2$ as shown in FIGS. 3C and 3D and if the press jig 56 causes the sensor chip 16 to move in one direction just through a predetermined stroke 6 substantially in parallel to the one end portion of the chip mounting member 18, an applied load P $(=3EI\delta/l^3)$ is inversely proportional to the thickness 13 of the adhesive layer 50 since the flexural rigidity (EI) is constant when the adhesive area of the adhesive layer and the material of the adhesive layer are the same. Thus, the degree of fixation of the sensor chip 16 to the one end portion of the chip mounting member 18 tends to be weaker as the thickness 1 of the adhesive layer 50 is larger or tends to be stronger as the thickness 1 of the adhesive layer 50 is smaller (for this reason, the thick adhesive layer 50 gives an impression that the degree of fixation of the sensor chip is loose while the thin adhesive layer 50 gives a stiff impression thereof).

Accordingly, in the case where the adhesive area of the adhesive layer and the material of the adhesive layer are the same, the adhesive layer is soft if the thickness of the adhesive layer (the cross-sectional area of the adhesive layer) is large, which brings about small distortion attributable to a difference from the linear expansion coefficient of the adhesive at a low temperature whereby the thermal stress acted on the adhesive layer is reduced. As a consequence of the reduction in thermal stress, an effect of a disposition of the viscoelastic properties on the sensor chip 16 is reduced and an effect of the deviation of accuracy due to the temperature response becomes smaller. Moreover, as a consequence of the reduction in thermal stress, an effect of deformation on the sensor chip 16 is reduced and the accuracy at a low temperature is improved.

Note that if the material of the selected adhesive layer is changed, then a predetermined value of the thickness of the adhesive layer is to be selected as appropriate and the adhesive layer is not limited to the above-described examples, a thin adhesive film may be used as the adhesive layer, for instance.

Moreover, examples of the material of the chip mounting member 18 serving as a support member for supporting the sensor chip 16 include an iron-nickel-based alloy and other metals such as stainless steel. As a consequence, it is possible to reduce the distortion of the sensor chip 16 due to a change in temperature and also to enhance the detection accuracy of the sensor chip 16 and to improve the deviation of detection accuracy linked to the temperature response.

In the above-described example, the sensor chip 16 in the sensor unit is supported by the one end portion of the chip mounting member 18 held in the hermetic glass 14. However, the present invention is not limited only to this example. In a still another example of the sensor chip junction structure according to the present invention, the sensor chip 16 may be configured to be directly fixed to a flat surface that forms the recess of the hermetic glass 14 described above without using the chip mounting member 18, for instance.

The terminal base 24 to array the input-output terminals group 40ai is molded by using a resin material such as polybutylene terephthalate (PBT). The terminal base 24 is provided with a hollow portion located inside with a predetermined volume as well as a plurality of holes into which the input-output terminals group 40ai are to be inserted. A lower end surface of the terminal base 24 is adhered to an upper end surface of the housing 12 by using a silicone-based adhesive in such a way as to cover an upper end surface of the hermetic glass 14. In this way, an annular adhesive layer 10a having a predetermined thickness is formed on the upper end surface of the housing 12. Moreover, a cover layer 10b made of a silicone-based adhesive is formed in a predetermined thickness on the entire upper end surface of the hermetic glass 14 from which the input-output terminals group 40ai project.

As shown in FIG. 4A, an annular protrusion 24P that projects toward the hermetic glass 14 is formed on an inner peripheral surface of the terminal base 24 that defines the hollow portion, which is the inner peripheral surface opposed to the upper end surface of the hermetic glass 14. A projection length of the annular protrusion 24P is set in accordance with viscosity and the like of the cover layer 10b. By forming the annular protrusion 24P as described above, part of the coated cover layer 10b is stretched and held by way of surface tension inside a small space between the annular protrusion 24P and a section of the inner peripheral surface of the terminal base 24 that defines the hollow portion, which is the section substantially orthogonal to the upper end surface of the hermetic glass 14. Thus, the cover layer 10b is coated without being unevenly gathered on one side in the hollow portion of the terminal base 24. In this way, a silicone-based adhesive layer 10 including the cover layer 10a and the cover layer 10b is formed as an electrostatic protection layer on the upper surface of the housing 12 and on the entire upper surface of the hermetic glass 14. Accordingly, by forming the electrostatic protection layer using the silicone-based adhesive as described above, electrostatic resistance of the sensor unit is enhanced without being influenced by the presence or absence of an ESD protection circuit.

The aforementioned silicone-based adhesive is preferably an addition-type one-component adhesive having flexibility, for example. The silicone-based adhesive may be an adhesive having a low-molecular siloxane bond, for example. Here, an epoxy-based adhesive may be used instead of the silicone-based adhesive, for instance.

A predetermined amount of a sealing material 26 is put in between an inner peripheral surface of the waterproof case 20 and an outer peripheral surface of the terminal base 24 as well as an outer peripheral surface of an end cap 22 connected to the terminal base 24 to cover the above-mentioned holes, and between the inner peripheral surface of the waterproof case 20 and an outer peripheral surface of the housing 12. The terminal base 24 and the end cap 22 are disposed inside the waterproof case 20 in such a way as to face the base plate 28 of the joint member 30 while interposing the above-described sensor unit in between.

An upper end surface of the end cap 22 projects upward from an open end of the waterproof case 20. In other words, a position of the upper surface of the end cap 22 is located higher than a position of an open end surface of the waterproof case 20.

To assemble the above-described pressure sensor, a sensor unit assembly (hereinafter also referred to as a workpiece) SA to be embedded in the pressure sensor is subjected to measurement of characteristics of the adhesive layer 50 in the workpiece SA in advance according to a given method of measuring characteristics of an adhesive. The workpiece SA comprises, as its main constituents: the cylindrical housing 12; the sensor chip 16 provided with a plurality of pressure detection elements; the chip mounting member 18 made of the metal for supporting the sensor chip 16 at the one end portion through the adhesive layer 50; the input-output terminals group 40ai (i=1 to 8); and a hermetic glass 14.

Figure 1:
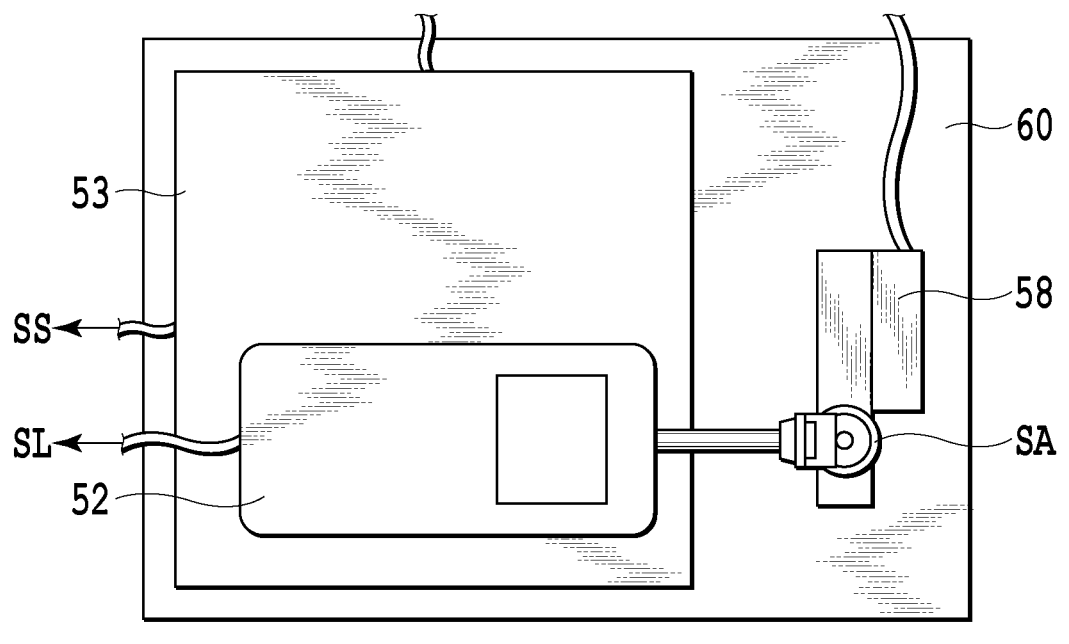
FIG. 1 is a diagram schematically illustrating a configuration of an example of a measurement apparatus used in an inspection process of manufacturing in an example of a sensor chip junction structure according to the present invention.

The measurement apparatus shown in FIG. 1 is used to implement an example of the above-mentioned method of measuring characteristics of an adhesive. The measurement apparatus is installed in an atmosphere at a room temperature in a range from 20° C. to 30° C. and at a humidity in a range from 10 to 80% RH, for example.

Figure 2A:
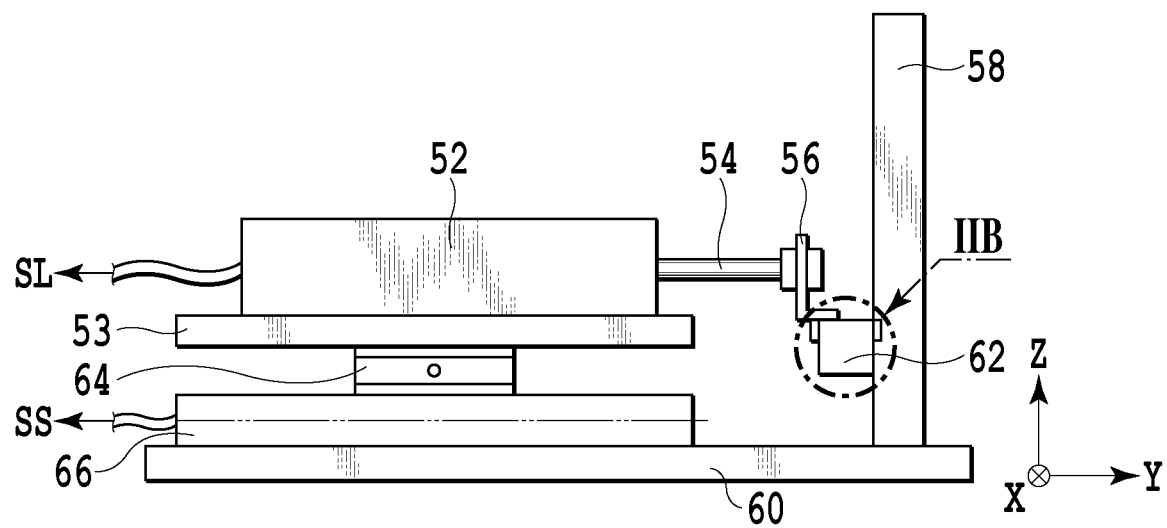
FIG. 2A is a front view illustrating the measurement apparatus shown in FIG. 1.

As shown in FIGS. 1 and 2A, for example, the measurement apparatus comprises an XY-axis stage, a Z-axis stage 58, a push-pull gauge 52 provided on a fixation table 53 on the XY-axis stage and configured to detect a load applied to the workpiece SA to be described later and to output a detection signal SL, and a personal computer (not shown) serving as a signal processing unit configured to form a characteristic curve (see FIG. 3G) based on the detection signal SL from the push-pull gauge 52 and on a detection signal SS that represents amounts of movement of mobile tables in an upper stage 64 and a lower stage 66 in the XY-axis stage. The personal computer includes a storage unit to store program data for controlling stages manufactured by Sigmakoki Co., Ltd. (product type: SGSP20-85) to be described later and to store data of load recording software (ZP Recorder produced by Imada Co., Ltd.).

Figure 2B:
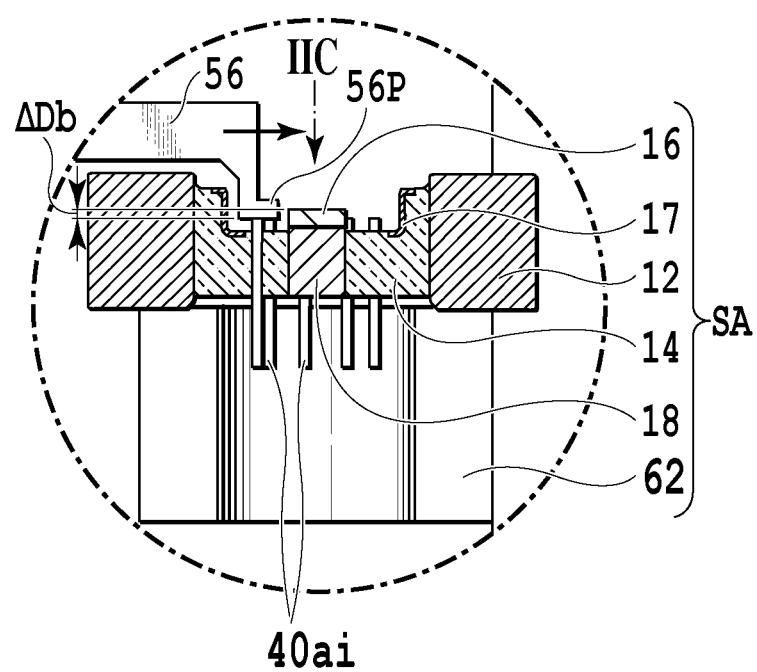
FIG. 2B is an enlarged diagram illustrating in enlarged dimension a part IIB in FIG. 2A.
Figure 2C:
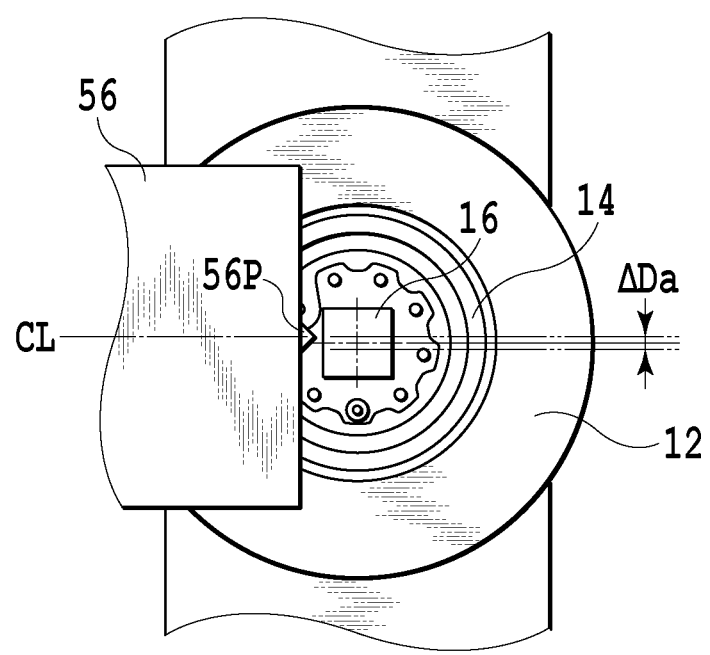
FIG. 2C is a diagram viewing from the direction of an arrow IIC of FIG. 2B.

A workpiece support base 62 configured to support the workpiece SA is movably provided on the Z-axis stage 58. As shown in FIG. 2B, the workpiece SA is detachably fixed to the workpiece support base 62 with a fitting machine screw such that the end surface of the housing 12 comes into contact with a mounting surface of the workpiece support base 62.

As shown in FIG. 2A, the XY-axis stage is disposed on a given base 60. The XY-axis stage comprises the lower stage 66 composed of a fixation table to be fixed to the base 60 and a mobile table, the upper stage 64 of the fixation table 53 to be connected to the mobile table of the lower stage 66, and the fixation table 53 connected to the mobile table provided movably relative to the upper stage 64. Each of the lower stage 66 and the upper stage 64 includes a driving motor (not shown) that drives the stage through a ball screw.

A stage manufactured by Sigmakoki Co., Ltd. (product type: SGSP20-85), for example, is used for each of the XY-axis stage and the Z-axis stage 58.

The mobile table of the lower stage 66 is made movable along the Y coordinate axis in the Cartesian coordinates shown in FIGS. 1 and 2A. On the other hand, the mobile table of the upper stage 64 is made movable along the X coordinate axis. The driving motor adopts a stepping motor or a servo motor, for example, and is configured to supply the detection signal SS that represents the amounts of movement of the mobile tables in the upper stage 64 and the lower stage 66 to the personal computer.

Figure 2D:
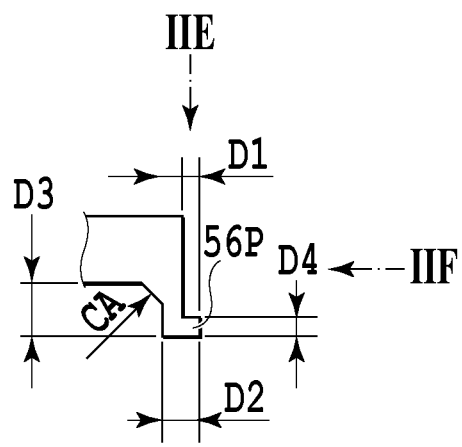
FIG. 2D is a partial enlarged diagram of a portion in FIG. 2B.
Figure 2E:
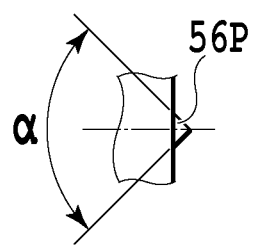
FIG. 2E is a diagram viewing from a direction of an arrow IIE of FIG. 2D.
Figure 2F:
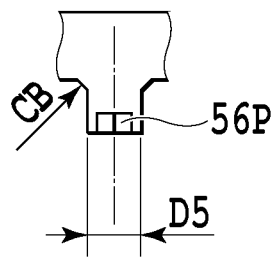
FIG. 2F is a diagram viewing from a direction of an arrow IIF of FIG. 2D.

The push-pull gauge 52 is fixed to a predetermined position of the fixation table 53. A push-pull gauge manufactured by Imada Co., Ltd. (product type ZP-50N), for example, is used as the push-pull gauge 52. The push-pull gauge 52 includes a push rod 54 in which the press jig 56 shown in FIG. 2B is provided at one end. As shown in the partial enlarged view of FIGS. 2D, 2E, and 2F, the press jig 56 is made of stainless steel (SUS303) and provided with a presser 56P at its tip. A width D5 of a neck part of the press jig 56 is set to 2.5 mm, for example. A length D2 of the neck part of the press jig 56 along it's the direction of movement is set to 1.7 mm, for example. A distance D3 from a lower end surface of the neck part of the press jig 56 to a body part thereof is set to 2.5 mm, for example. A portion that is continuous from the neck part to the body part of the press jig 56 is provided with a chamfer CA at a width f of 1 mm and a chamfer CB at a width of 0.5 mm. Moreover, other portions of the neck part of the press jig 56 are subjected to given slight-chamfering.

The presser 56P is formed substantially into a triangular prism. A height D4 of the presser 56P is set to 1 mm, for example. A height D1 to an apex of the triangle of the presser 56P is set to 0.7 mm, for example. A triangle of narrow angle α of the presser 56P is set to 90°, for example.

Before starting the measurement, the presser 56P at the tip of the press jig 56 is located at a position away by a predetermined distance, such as about 0.001 mm from a side surface of the sensor chip 16 of the workpiece SA supported by the workpiece support base 62 in such a way as to face the side surface, for example. A position of the apex of the triangle of the presser 56P located on the central axis CL of the press jig 56 is set to be located within a predetermined range ΔDa of ±0.1 mm away from the center line of the sensor chip 16, for instance. In this instance, a distance ΔDb from a lower end surface of the presser 56P to an upper surface of the sensor chip 16 is set within a range from 0.3 mm±0.2 mm, for example. After the presser 56P of the press jig 56 comes into contact with the side surface of the sensor chip 16 of the workpiece SA, the push-pull gauge 52 is allowed to detect the load applied to the tip of the press jig 56 (reaction force from the sensor chip 16) and to supply the detection signal SL to the personal computer. In this instance, the signal is supplied by using a load sampling frequency equal to or above 1 Hz. The fixation table 53 and the presser 56P of the press jig 56 are caused to move just by a predetermined stroke at a moving velocity of 1 μm/s, for instance, after the contact with the side surface of the sensor chip 16. As a consequence, shearing force in the direction of movement (the direction of the Y coordinate axis) of the tip of the press jig 56 indicated with an arrow in FIG. 2B is applied to the adhesive layer 50.

The personal computer forms characteristic lines that describe the characteristics of the adhesive layer 50 in the sensor unit based on the detection signal SS and the detection signal SL, and displays the characteristic lines on a display unit. The display unit displays characteristic lines Lc, Lc', Ld1, and Ld2 as shown in FIG. 3G, for instance. FIG. 3G plots the characteristic lines each represents a course from an elastic displacement to a plastic displacement of the adhesive layer to which the shearing force is applied, while indicating the load (N) applied from the tip of the press jig 56 on the vertical axis and indicating a moving distance (μm) of the tip of the press jig 56 on the horizontal axis. Here, the moving distance (μm) of the tip of the press jig 56 is determined assuming that a position of the tip end of the press jig being pushed into the sensor chip 16 and coming into contact with an outer peripheral surface of the sensor chip 16 is defined as 0 (zero) (μm). Concerning the measurement of the load, it is preferable to conduct the measurement in the state that the workpiece SA is not turned while pushing the tip of the press jig 56 into the sensor chip 16.

FIG. 3G plots the characteristic lines Ld1 and Ld2 that represent characteristics of the adhesive layer 50 in the sensor unit and the characteristic line Lc and Lc' that represent characteristics of an adhesive layer in a comparative example.

The characteristic lines Ld1 and Ld2 show the characteristics of the adhesive layers with thicknesses set to 5 μm and 20 μm, respectively. The material of each adhesive layer is a silicone-based gel, for instance. The characteristic lines Lc and Lc' show the characteristics of another adhesive layer with a thickness set to 1 μm. The material of this adhesive layer is a silicone-based gel, for instance.

According to the characteristic line Ld1, the load is gradually increased along with an increase in moving distance and the load has a value in a range from 0.1 (N) to 0.3 (N) inclusive at the moving distance in a range from 40 μm to 60 μm inclusive. According to the characteristic line Ld2, the load is gradually increased along with the increase in moving distance and the load has a value in a range from 0.03 (N) to 0.05 (N) inclusive at the moving distance in the range from 40 μm to 60 μm inclusive. On the other hand, according to the characteristic line Lc that represents the characteristic of the comparative example, the load is sharply increased along with the increase in moving distance and the load has a value in a range from 0.75 (N) to 1.05 (N) inclusive at the moving distance in the range from 40 μm to 60 μm inclusive. According to the characteristic line Lc', the load is increased at a relatively lower slope than the slope of the characteristic line Lc along with the increase in moving distance and the load has a value of 0.1 (N) in the case where the moving distance is 20 μm, a value of 0.6 (N) in the case where the moving distance is 40 μm, and a value in a range from 0.6 (N) to 0.95 (N) inclusive at the moving distance in the range from 40 μm to 60 μm inclusive.

The pressure sensor embedding the workpiece SA as in the above-described example and the pressure sensor embedding the sensor unit as in the comparative example were manufactured and the respective pressure sensors were subjected to verification of error of pressure detection integrated accuracy with the change in ambient temperature in accordance with a predetermined temperature cycle in a thermostatic chamber by the inventor of the present application. As a consequence, the sensor chips 16 adhered by use of the adhesive layers 50 having the characteristics in accordance with the characteristic lines Ld1 and Ld2 brought about the characteristics of the sensor chips having relatively small error of pressure detection integrated accuracy with the change in ambient temperature. Moreover, the sensor chip 16 adhered by use of the adhesive layer having the characteristic in accordance with the characteristic line Lc' brought about the characteristic of the sensor chip having relatively small error of pressure detection integrated accuracy with the change in ambient temperature. On the other hand, the sensor chip adhered by use of the adhesive layer having the characteristic in accordance with the characteristic line Lc brought about the characteristic of the sensor chip having relatively large error of pressure detection integrated accuracy with the change in ambient temperature.

Therefore, in the case where the obtained characteristic line is the characteristic line having a region COI (see a hatched region in FIG. 3G) in which the load (the shearing force) is above zero and equal to or below 0.6 (N) in the case where the moving distance is in the range from 20 μm to 60 μm inclusive, the characteristic of the high-accuracy sensor chip with relatively small error of pressure detection integrated accuracy with the change in temperature is obtained with the sensor chip adhered by using the adhesive layer having the characteristic in accordance with the characteristic line. The region COI is a region where the load is equal to or below 0.6 (N) at the moving distance in the range from 20 μm to 60 μm inclusive, which is the region surrounded by a straight line that links a point P1 (moving distance, load: 20 μm, 0.1 (N)) and a point P2 (moving distance, load: 40 μm, 0.6(N)). In other words, it can be said that the region COI is a region where the adhesive layer is relatively soft. Moreover, in the region COI, the characteristic line preferably crosses a region where the load is equal to or below 0.3 (N) and surrounded by a straight line that links a point P3 (moving distance, load: 50 μm, 0.3 (N)) and a point P0 (moving distance, load: 20 μm, 0 (N)). In the case of this region, it is confirmed based on a result of verification by the inventor of the present application that the thickness of the adhesive layer is preferably set in a range from 0.5 μm to 1.0 μm inclusive or in a range from 1.0 μm to 100 μm inclusive, for example.

Figure 3E:
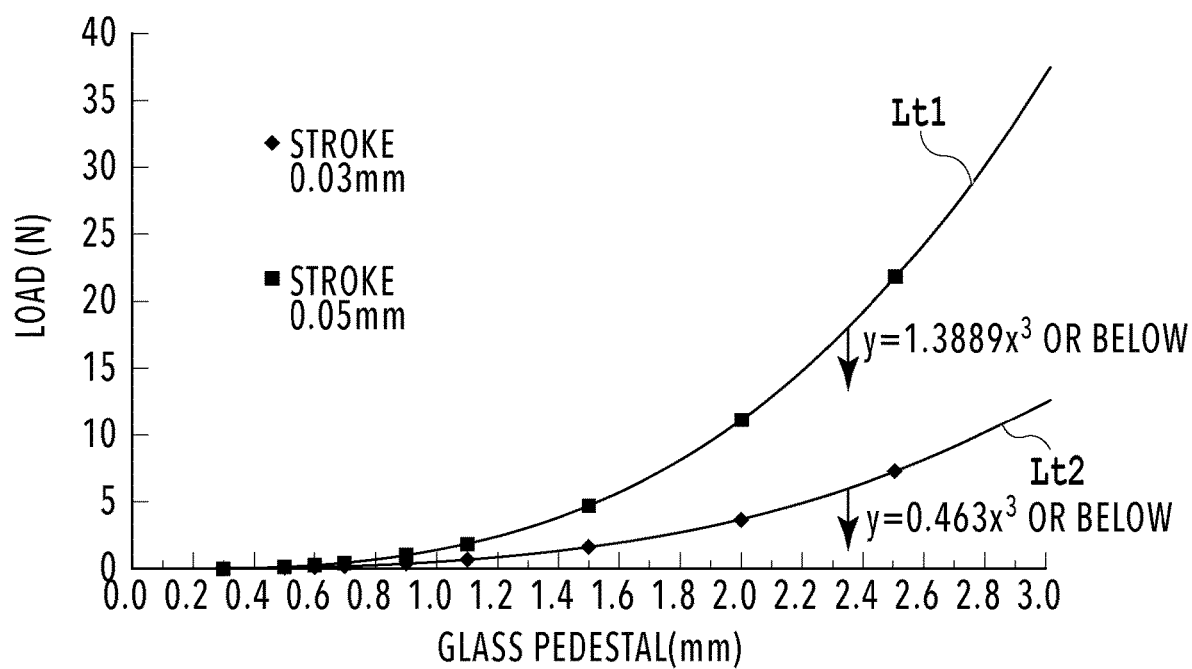
FIG. 3E is a characteristic diagram representing characteristics of the adhesive layer depending on thicknesses of the respective glass pedestals in the sensor units, which are obtained by using the measurement apparatus shown in FIG. 1.
Figure 3F:
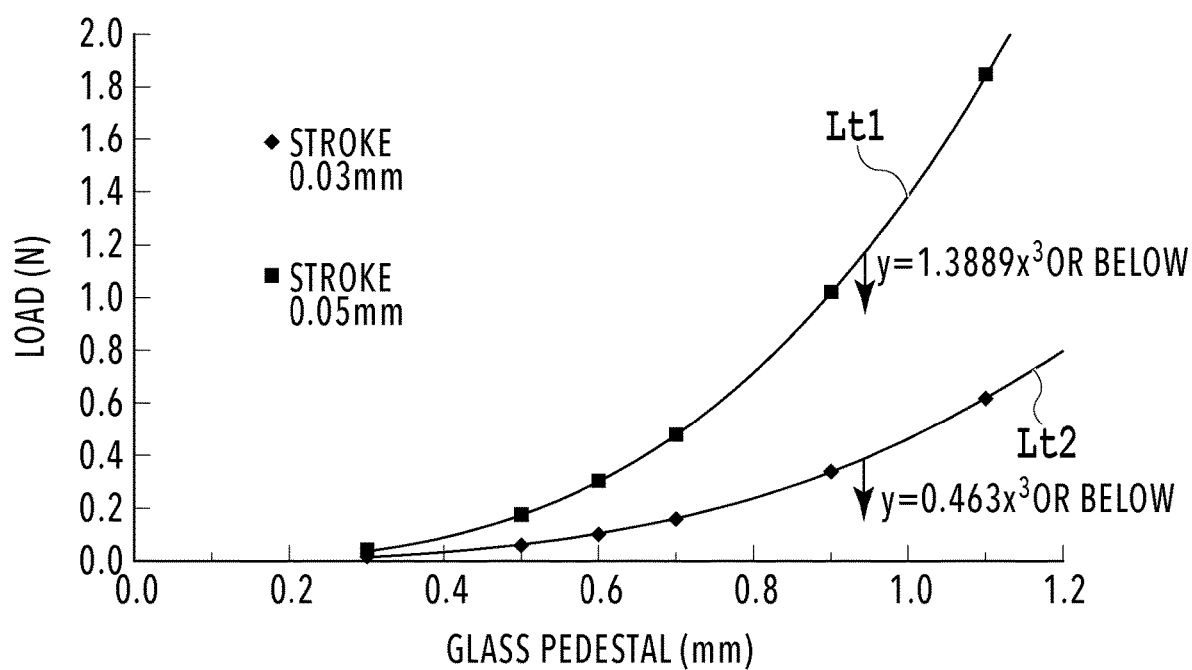
FIG. 3F is a partial enlarged characteristic diagram of a portion of the characteristic diagram shown in FIG. 3E.
Figure 3G:
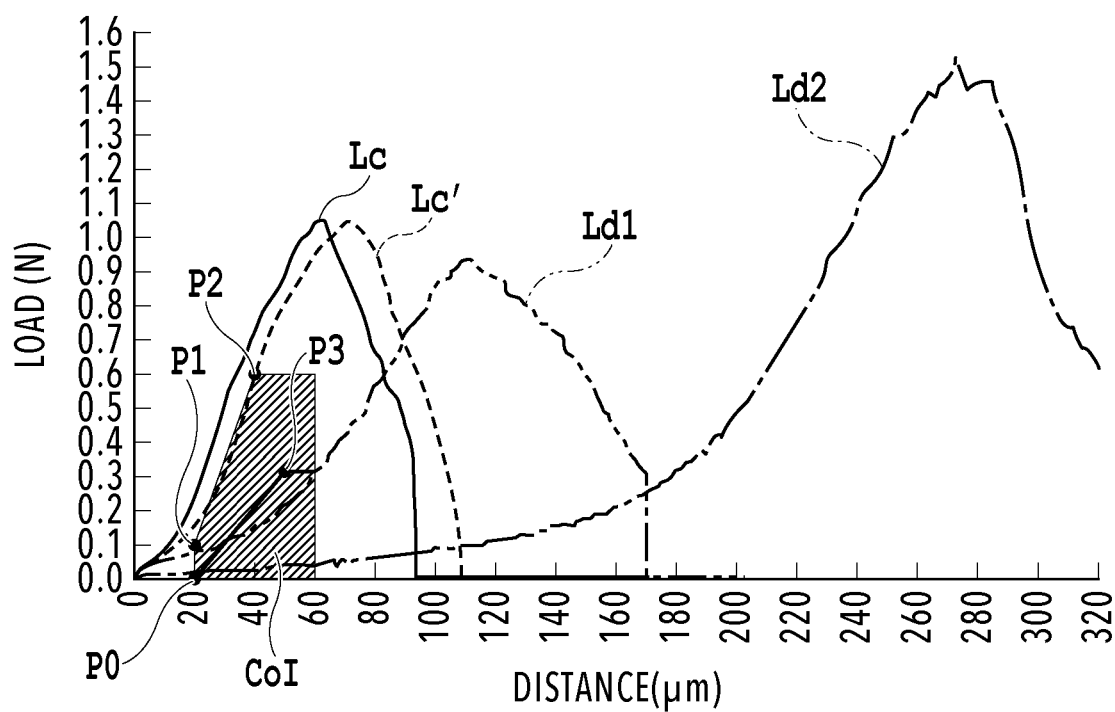
FIG. 3G is a characteristic diagram representing characteristics of the adhesive layers in the sensor unit, which are obtained by using the measurement apparatus shown in FIG. 1.

FIGS. 3E and 3F show changes in load (y) applied to the adhesive layer 50 in the sensor unit according to respective thicknesses x (mm) of the glass pedestals for the above-described sensor chip 16 (in the size in the range from 2.5-mm square to 4.0-mm square inclusive) in the case where the moving distances of the tip of the press jig 56 in the above-described measurement apparatus are 30 μm and 50 μm, for example. Characteristic lines Lt1 and Lt2 represent characteristics of the load (the shearing force) (N) applied to the adhesive layers formed on the glass pedestals with the thicknesses x set in a range from 0.3 mm to 3.0 mm in the case where the respective moving distances of the tip of the press jig 56 are 50 μm and 30 μm, for example. Note that each of a curve ($y=1.3889x^3$) of the characteristic line Lt1 and a curve ($y=0.463x^3$) of the characteristic line Lt2 is a cubic curve that is approximated by a least squares approximation curve while using each measurement value. However, y is the load (N) and x is the thickness of the glass pedestal. The thickness of the adhesive layer 50 is in a range from 0.5 µm to 100 µm inclusive or preferably in a range from 5 µm to 100 µm inclusive, for example.

Reasons for setting the moving distances of the tip of the press jig 56 to 30 µm and 50 µm as the examples of the range for evaluation of the adhesive layer 50 are that the distances mentioned above fall in the range from 20 µm to 60 µm inclusive, that the variation of the load can be accurately detected in the case where the moving distance is 30 µm, that the variation of the load can be even more accurately detected in the case where the moving distance is 50 µm, and that the moving distances fall in a range where the adhesive layer 50 itself is kept from being destroyed by plastic deformation.

According to the result of verification by the inventor of the present application, it is verified that the characteristic of the sensor chip having relatively small error of pressure detection integrated accuracy with the change in ambient temperature is obtained by using the sensor chip 16 adhered by using any of the adhesive layers 50 having the characteristics in accordance with the characteristic line Lt1 and the characteristic line Lt2. Moreover, it is also verified that the characteristic of the sensor chip having relatively small error of pressure detection integrated accuracy with the change in ambient temperature is obtained by using the sensor chip 16 on any of the characteristic line in a range where the load is above zero and equal to or below the characteristic line Lt1 and on the characteristic line in a range where the load is above zero and equal to or below the characteristic line Lt2.

As it is clear from the above description, a good pressure sensor embedding the aforementioned sensor unit based on any of the above-described characteristic lines is presumably available without requiring a test on the error of pressure detection integrated accuracy with the change in ambient temperature of the pressure sensor in accordance with the predetermined temperature cycle in the thermostatic chamber. Note that the any of the above-mentioned characteristic lines in FIG. 3F which can bring about the characteristic of the high-accuracy sensor chip with relatively small error of pressure detection integrated accuracy with the change in temperature may preferably be a characteristic line that crosses a region where the load (the shearing force) is in a range from 0.01 (N) to 0.6 (N) inclusive at the moving distance in the range from 40 µm to 60 µm. In order to construct an adhesion structure having the aforementioned characteristic, it is possible to select the coating area and thickness of the adhesive on the sensor chip as appropriate. In addition, it is possible to select freely regarding the adhesion structure including a capability of using an adhesive tape or the like. As it is clear from the above description, it is understood that the error of pressure detection accuracy (the output characteristic) of the sensor chip can be confined to the predetermined range by using the sensor unit (the workpiece SA) alone, and production efficiency of such pressure sensors can be increased at the same time.

The invention claimed is:

1. A sensor chip junction structure comprising:
an adhesive layer; and
a support member for adhering and supporting a sensor chip integral with a glass pedestal through the adhesive layer coated on an end surface of the support member, wherein
if a thickness of the glass pedestal is defined as x (mm) and shearing force is defined as y (N), the adhesive layer through which the sensor chip integral with the glass pedestal is adhered to the support member has a characteristic in which the shearing force y (N) satisfying a relational expression (1), $$0<y<1.3889x^3 \qquad (1),$$

is applied to the adhesive layer in a case where the sensor chip integral with the glass pedestal is moved substantially in parallel to the end surface of the support member in an amount of 50 µm.

2. A sensor chip junction structure comprising:
an adhesive layer; and
a support member for adhering and supporting a sensor chip integral with a glass pedestal through the adhesive layer coated on an end surface of the support member, wherein
if a thickness of the glass pedestal is defined as x (mm) and shearing force is defined as y (N), the adhesive layer through which the sensor chip integral with the glass pedestal is adhered has a characteristic in which the shearing force y (N) satisfying a relational expression (2), $$0 \le y \le 0.463x^3 \qquad (2),$$

is applied to the adhesive layer in a case where the sensor chip integral with the glass pedestal is moved substantially in parallel to the end surface of the support member in an amount of 30 µm.

3. A pressure sensor comprising:
the sensor chip junction structure according to claim 1.

4. A pressure sensor comprising:
a liquid sealing chamber isolated by a diaphragm made of a metal, the liquid sealing chamber being filled with a pressure transfer medium;
a sensor chip provided on an end surface of a support member that is located in the liquid sealing chamber and faces the diaphragm, wherein a pressure detection element for detecting a pressure in the liquid sealing chamber and an integrated electronic circuit for processing an output signal from the pressure detection element are integrally formed in the sensor chip;
a lead pin for leading the output signal from the sensor chip to outside; and
the sensor chip junction structure according to claim 3.

5. The pressure sensor according to claim 3, wherein the sensor chip has a size in a range from 2.5 mm square to 4.0 mm square inclusive.

6. The pressure sensor according to claim 5, wherein a thickness of the glass pedestal is in a range from 0.3 mm to 0.5 mm inclusive.

7. The pressure sensor according to claim 5, wherein a thickness of the glass pedestal is in a range from 0.5 mm to 0.7 mm inclusive.

8. The pressure sensor according to claim 5, wherein a thickness of the glass pedestal is in a range from 0.7 mm to 0.9 mm inclusive.

9. The pressure sensor according to claim 5, wherein a thickness of the glass pedestal is in a range from 0.9 mm to 1.1 mm inclusive.

10. The pressure sensor according to claim 5, wherein a thickness of the glass pedestal is in a range from 1.1 mm to 1.5 mm inclusive.

11. The pressure sensor according to claim 5, wherein a thickness of the glass pedestal is in a range from 1.5 mm to 2.0 mm inclusive.

12. The pressure sensor according to claim 5, wherein a thickness of the glass pedestal is in a range from 2.0 mm to 2.5 mm inclusive.

13. A pressure sensor comprising:
the sensor chip junction structure according to claim 1, wherein
the adhesive layer is formed from any one of a silicone-based gel, a fluorine-based gel, a silicone-based adhesive, and a fluorine-based adhesive, and
a thickness of the adhesive layer is in a range from 0.5 μm to 100 μm inclusive or preferably in a range from 5 μm to 100 μm inclusive.

14. The pressure sensor according to claim 3, wherein
the adhesive layer is formed from any one of a silicone-based gel, a fluorine-based gel, a silicone-based adhesive, and a fluorine-based adhesive, and
a thickness of the adhesive layer is in a range from 0.5 μm to 100 μm inclusive or preferably in a range from 5 μm to 100 μm inclusive.

15. A pressure sensor comprising:
the sensor chip junction structure according to claim 2.

16. A pressure sensor comprising:
a liquid sealing chamber isolated by a diaphragm made of a metal, the liquid sealing chamber being filled with a pressure transfer medium;
a sensor chip provided on an end surface of a support member that is located in the liquid sealing chamber and faces the diaphragm, wherein a pressure detection element for detecting a pressure in the liquid sealing chamber and an integrated electronic circuit for processing an output signal from the pressure detection element are integrally formed in the sensor chip;
a lead pin for leading the output signal from the sensor chip to outside; and
the sensor chip junction structure according to claim 15.

17. The pressure sensor according to claim 15, wherein the sensor chip has a size in a range from 2.5 mm square to 4.0 mm square inclusive.

18. The pressure sensor according to claim 17, wherein a thickness of the glass pedestal is in a range from 0.3 mm to 0.5 mm inclusive.

19. The pressure sensor according to claim 17, wherein a thickness of the glass pedestal is in a range from 0.5 mm to 0.7 mm inclusive.

20. The pressure sensor according to claim 17, wherein a thickness of the glass pedestal is in a range from 0.7 mm to 0.9 mm inclusive.

21. The pressure sensor according to claim 17, wherein a thickness of the glass pedestal is in a range from 0.9 mm to 1.1 mm inclusive.

22. The pressure sensor according to claim 17, wherein a thickness of the glass pedestal is in a range from 1.1 mm to 1.5 mm inclusive.

23. The pressure sensor according to claim 17, wherein a thickness of the glass pedestal is in a range from 1.5 mm to 2.0 mm inclusive.

24. The pressure sensor according to claim 17, wherein a thickness of the glass pedestal is in a range from 2.0 mm to 2.5 mm inclusive.

25. A pressure sensor comprising:
the sensor chip junction structure according to claim 2, wherein
the adhesive layer is formed from any one of a silicone-based gel, a fluorine-based gel, a silicone-based adhesive, and a fluorine-based adhesive, and
a thickness of the adhesive layer is in a range from 0.5 μm to 100 μm inclusive or preferably in a range from 5 μm to 100 μm inclusive.

26. A pressure sensor comprising:
the sensor chip junction structure according to claim 15, wherein
the adhesive layer is formed from any one of a silicone-based gel, a fluorine-based gel, a silicone-based adhesive, and a fluorine-based adhesive, and
a thickness of the adhesive layer is in a range from 0.5 μm to 100 μm inclusive or preferably in a range from 5 μm to 100 μm inclusive.

* * * * *